US007553557B2

(12) United States Patent
Thompson et al.

(10) Patent No.: US 7,553,557 B2
(45) Date of Patent: *Jun. 30, 2009

(54) ORGANIC LIGHT EMITTING DEVICES WITH ELECTRON BLOCKING LAYERS

(75) Inventors: Mark E. Thompson, Anaheim, CA (US); Vadim Adamovich, Lawrenceville, NJ (US); Xiaofan Ren, Los Angeles, CA (US); Arnold Tamayo, Glendale, CA (US); Peter I. Djurovich, Los Angeles, CA (US)

(73) Assignee: The University of Southern California, Los Angeles, CA (US)

( * ) Notice: Subject to any disclaimer, the term of this patent is extended or adjusted under 35 U.S.C. 154(b) by 531 days.

This patent is subject to a terminal disclaimer.

(21) Appl. No.: 11/230,851

(22) Filed: Sep. 19, 2005

(65) Prior Publication Data

US 2006/0024526 A1 Feb. 2, 2006

Related U.S. Application Data

(63) Continuation of application No. 10/402,684, filed on Mar. 28, 2003, now Pat. No. 6,951,694, which is a continuation-in-part of application No. 10/112,257, filed on Mar. 29, 2002, now Pat. No. 6,869,695, and a continuation-in-part of application No. 10/328,914, filed on Dec. 24, 2002, now Pat. No. 6,863,997.

(60) Provisional application No. 60/368,496, filed on Mar. 29, 2002.

(51) Int. Cl.
*H01L 51/54* (2006.01)
(52) U.S. Cl. .................. 428/690; 428/917; 313/504; 313/506; 257/E51.044
(58) Field of Classification Search ................. 548/103
See application file for complete search history.

(56) References Cited

U.S. PATENT DOCUMENTS

| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,538 A | 1/2000 | Burrows et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,420,031 B1 | 7/2002 | Parthasarathy et al. |
| 6,468,819 B1 | 10/2002 | Kim et al. |
| 6,469,437 B1 | 10/2002 | Parthasarathy et al. |
| 6,521,360 B2 | 2/2003 | Lee et al. |
| 6,696,177 B1 | 2/2004 | Hatwar |
| 6,951,694 B2 * | 10/2005 | Thompson et al. .......... 428/690 |
| 2001/0019782 A1 | 9/2001 | Igarashi et al. |
| 2001/0053462 A1 | 12/2001 | Mishima |
| 2002/0025419 A1 | 2/2002 | Lee et al. |
| 2002/0071963 A1 | 6/2002 | Fujii |
| 2002/0125818 A1 | 9/2002 | Sato et al. |
| 2002/0182441 A1 | 12/2002 | Lamansky et al. |
| 2002/0197511 A1 | 12/2002 | D'Andrade et al. |
| 2003/0059647 A1 | 3/2003 | Thompson et al. |
| 2003/0068528 A1 | 4/2003 | Thompson et al. |
| 2003/0230980 A1 | 12/2003 | Forrest et al. |

OTHER PUBLICATIONS

Baldo et al., "Highly Efficient Phosphorescent Emission from Organic Electroluminescent Devices," Nature, vol. 395, 151-154, 1998.
Baldo et al., "Very High-efficiency Green Organic Light-emitting Devices Based on Electrophosphorescence," Appl. Phys. Lett., vol. 75, No. 3, 4-6 (1999).
Adachi et al., "Nearly 100% Internal Phosphorescent Efficiency in an Organic Light Emitting Device," J. Appl. Phys., 90, 5048 (2001).
Lamansky et al., "Synthesis and Characterization of Phosphorescent Cyclometalated Iridium Complexes," Inorganic Chemistry, 2001, 40(7), 1704-1711.
Adachi et al., "High-efficiency Red Electrophosphorescence Devices," Applied Physics Letters, vol. 78, No. 11, 1622-1624 (2001).
Pavlik et al., "Phototransposition Chemistry of 1-phynylpyrazole Experimental and Computational Studies," Journal of the American Chemical Society, vol. 115, 7645-7652 (1993).
Lohse et al., Synlett. 1999, 1, 45-48 "The Palladium Catalysed Suzuki Coupling of 2- and 4- chloropyridines".
Yamamoto et al., "Palladium-catalyzed Synthesis of Triarylamines from Aryl Halides and Diarylamines," Tetrahedron Letters 39 (1998) 2367-2370.
C. Adachi, et al., "High Efficiency Organic Light Emitting Diodes Using Electrophosphorescence", Am. Phys. Soc., Series Ii, vol. 46, No. I, Part Ii, p. 863 (Mar. 2001).
M.A. Baldo, et al., "Excitonic Singlet-triplet Ratio in a Semiconducting Organic Thin Film", Phys. Rev., B. vol. 60, No. 20, pp. 14422-14428 (Nov. 1999).
R.h. Friend, et al., "Electroluminescence in Conjugated Polymers", Nature (London), vol. 397, pp. 121-128 (Jan. 1999).
Y. Cao, et al., "Improved Quantum Efficiency for Electroluminescence in Semiconducting Polymers", (London), vol. 397, pp. 414-417 (Feb. 1999).

(Continued)

*Primary Examiner*—Marie R. Yamnitzky
(74) *Attorney, Agent, or Firm*—Kenyon & Kenyon LLP

(57) ABSTRACT

The present invention relates to organic light emitting devices (OLEDs), and more specifically to efficient OLEDs having electron blocking layers. The devices of the present invention comprise at least one electron blocking layer which functions to confine electrons to specific regions of the light emitting devices. The present invention also relates to materials for use as electron blockers that show increased stability when incorporated into an organic light emitting device.

2 Claims, 14 Drawing Sheets

OTHER PUBLICATIONS

P.I. Kvam, et al. "Spectroscopic and Electrochemical Properties of Some Mixed-ligand Cyclometalated Platinum (Ii) Complexes Derived from 2-phenylpridine", Acta. Chem. Scand. 49, pp. 335-343 (1995).

N. Tessler, et al., "Current Heating in Polymer Light Emitting Diodes", Appl. Phys. Lett. 73, pp. 732-734 (1998).

M.a. Baldo, et al., "Transient Analysis of Organic Electrophosphorescence: I. Transient Analysis of Triplet Energy Transfer", Phys. Rev. B vol. 62, pp. 10958-10966 (Oct. 15, 2000).

W.e. Ford, et al., "Reversible Triplet-triplet Energy Transfer Within a Covalently Linked Bichomophoric Molecule", J. Phys. Chem., 96, pp. 2917-2920 (1992).

A. Harriman, et al., "A Ruthenium (Ii) Tris (2,2'-bipyridine) Derivative Possessing a Triplet Lifetime of 42us" R. Chem. Commun., pp. 735-736 (1999).

J. Kido, et al., Multilayer White Light-emitting Organic Electroluminescent Device, Science, vol. 267, No. 5202, pp. 1332-1334 (Mar. 1995).

M. Berggren, et al., "White Light from a Electroluminescent Diode Made from Poly[3(4-octylphenyl)-2,2'-bithiophene] and an Oxadiazole Derivative", J. Appl. Phys. vol. 76, No. 11, pp. 7520-7534 (Dec. 1994).

J. Feng, et al. "White Light Emission from Exciplex Using Tris-(8-hydroxyquinoline) Aluminum as Chromaticity-tuning Layer", Appl. Phys. Lett., vol. 78, No. 25, pp. 3947-3949 (Jun. 2001).

Andrew Gilbert and Jim Baggott, Essentials of Molecular Photochemistry, 1991, Crc Press, Boston, pp. 145-167.

C. Adachi, et al., "Endothermic Energy Transfer: a Mechanism for Generating Very Efficient High-energy Phosphorescent Emission in Organic Materials", Appl. Phys. Lett., vol. 79, No. 13, pp. 2082-2084 (Sep. 2001).

J. Kido et al., "Single-layer White Light-Emitting Organic Electroluminescent Devices Based on Dye-dispersed Poly (N-vinylcarbazole)" Appl. Phys. Lett., Vole. 67, No. 16, pp. 2281-2283 (Oct. 1995).

D. J. Milliron et al. "Surface Oxidation Activates Indium Tin Oxide for Hole Injection" J. Appl. Phys., vol. 87, No. 1, pp. 572-576 (Jan. 2000).

M.a. Baldo, et al., "Transient Analysis of Organic Electrophosphorescence: I. Transient Analysis of Triplet-triplet Annihilation" Phys. Rev. B. vol. 62, No. 16, pp. 10967-10977 (Oct. 2000).

L.s. Hung, et al., "Voltage Reduction in Organic Light-Emitting Diodes", Appl. Phys. Lett. 78, pp. 3732-3734 (2001).

X. Jiang, et al., "White-Emitting Organic Diode with a Doped Blocking Layer Between Hole- and Electron-transporting Layer", J. Phys. D: Appl. Phys. 33, pp. 473-476 (2000).

B.w. D'andrade, et al., "Controlling Exciton Diffusion in Multi-layer White Phosphorescent Organic Light Emitting Devices", Adv. Mater. (2001).

M. Pope, et al., Electronic Processes in Organic Crystals, Oxford University Press, Ny, 1982.

N.J. Turro, Modern Molecular Photochemistry, University Science Books, Mill Valley, 1991.

S.w. Lai, et al., "Spectroscopic Properties of Luminescent Platinum (Ii) Complexes Containing 4, 4' 4"-tri-tert-butyl-2,2':6',2"-terpyridine ((T)bu(3)tpy)", Inorg. Chem. 38, pp. 4262-4267, (1999).

S.w. Lai et al., "Probing D(8)-d(9) Interactions in Luminescent Mono- and Binuclear Cyclometalated Platinum (Ii) Complexes of 6-phenyl-2,2'-bipyridines", Inorg. Chem. 38, pp. 4046-4055 (1999).

C. Adachi, et al., "High-efficiency organic electrophosphorescent devices with tris(2-phenylpyridine) iridium doped into electron-transporting materials", App. Phys. Lett., vol. 77, No. 6, pp. 904-906, (Aug. 7, 2000).

U.S. Appl. No. 60/291,496, Entitled "High Efficiency Multi-Color Electro-Phosphorescent Oleds", Filed May 16, 2001.

U.S. Appl. No. 09/931,948 to Lu et al., filed Aug 20, 2001.

U.S. Appl. No. 10/233,470 to Shtein et al., filed Sep. 4, 2002.

* cited by examiner

- LUMO 1.9 eV
- HOMO 5.1 ev
- $E_{triplet}$ 3.1eV tris(phenylpyrazole) Iridium
(Irppz)

- LUMO 2.3 eV
- HOMO 5.3 ev
- $E_{triplet}$ 2.4eV

Iridium(III) bis(1-phenylpyrazolato,N, C2')
(2,2,6,6-tetramethyl-3,5-heptanedionato-O,O)
ppz$_2$Ir(dpm)

A. Device without
e- blocking layer

B. Device with
e- blocking layer

✦ emission from this layer

ORGANIC LIGHT EMITTING DEVICES WITH ELECTRON BLOCKING LAYERS

RELATED APPLICATIONS

This application is a continuation of U.S. patent application Ser. No. 10/402,684, filed Mar. 28, 2003, now U.S. Pat. No. 6,951,694, which is a continuation-in-part of U.S. application Ser. No. 10/112,257, filed Mar. 29, 2002, now U.S. Pat. No. 6,869,695; and Ser. No. 10/328,914, filed Dec. 24, 2002, now U.S. Pat. No. 6,863,997, and also claims the benefit of U.S. Provisional Application No. 60/368,496, filed Mar. 29, 2002, which are each incorporated herein by reference in their entirety.

RESEARCH AGREEMENTS

The claimed invention was made by, on behalf of, and/or in connection with one or more of the following parties to a joint university-corporation research agreement: Princeton University, The University of Southern California and Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to efficient OLEDs having electron blocking layers. The devices of the present invention comprise at least one electron blocking layer which functions to confine electrons to specific regions of the light emitting devices. The present invention also relates to materials for use as electron blockers that show increased stability when incorporated into an organic light emitting device.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

High efficiency red and green phosphorescent OLEDs utilize a hole blocking layer (HBL) to confine excitons and holes within the emissive layer. The need for an electron blocking layer (EBL), which blocks electron and exciton leakage to the HTL, has not been generally needed for these OLEDs. The need for an electron blocking layer in electorphosphorescent devices has only recently become necessary. Adachi, C.; Baldo, M. A.; Forrest, S. R.; Lamansky, S.; Thompson, M. E.; Kwong, R. C. *Appl. Phys. Lett.* 2001; 78, 1622.

SUMMARY OF THE INVENTION

An organic light emitting device is provided. The devices of the present invention comprise an electron blocking layer, wherein the electron blocking layer comprises a compound of the formula I

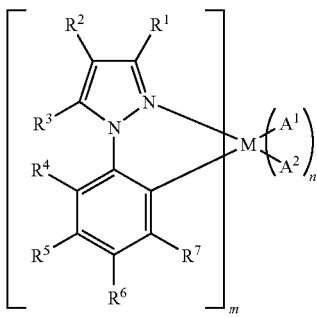

wherein M is a metal;

each $A^1$ and $A^2$ is, independently, a monodentate ligand; or $A^1$ and $A^2$ are covalently joined together to form a bidentate ligand;

each of $R^1$, $R^2$, $R^3$, $R^4$, $R^5$, $R^6$, and $R^7$ is, independently, H, alkyl, alkenyl, alkynyl, alkylaryl, CN, $CF_3$, $C_xF_{2x+1}$, trifluorovinyl, $CO_2R$, $C(O)R$, $NR_2$, $NO_2$, OR, halo, aryl, heteroaryl, substituted aryl, substituted heteroaryl or a heterocyclic group, and additionally, or alternatively, any one or more of $R^1$ and $R^2$, or $R^2$ and $R^3$, or $R^3$ and $R^4$, or $R^4$ and $R^5$, or $R^5$ and $R^6$, or $R^6$ and $R^7$ together form, independently, a fused 5- to 6-member cyclic group, wherein said cyclic group is cycloalkyl, cycloheteroalkyl, aryl, or heteroaryl, and wherein the fused 5- to 6-member cyclic group cyclic group may be optionally substituted with one or more of alkyl, alkenyl, alkynyl, alkylaryl, CN, $CF_3$, $C_xF_{2x+1}$, trifluorovinyl, $CO_2R$, $C(O)R$, $NR_2$, $NO_2$, OR, halo;

each R is independently H, alkyl, alkenyl, alkynyl, alkylaryl, and aryl;

m is 1, 2, or 3; and n is 0, 1, or 2, wherein m+n equals 3.

DETAILED DESCRIPTION

Figure 1:
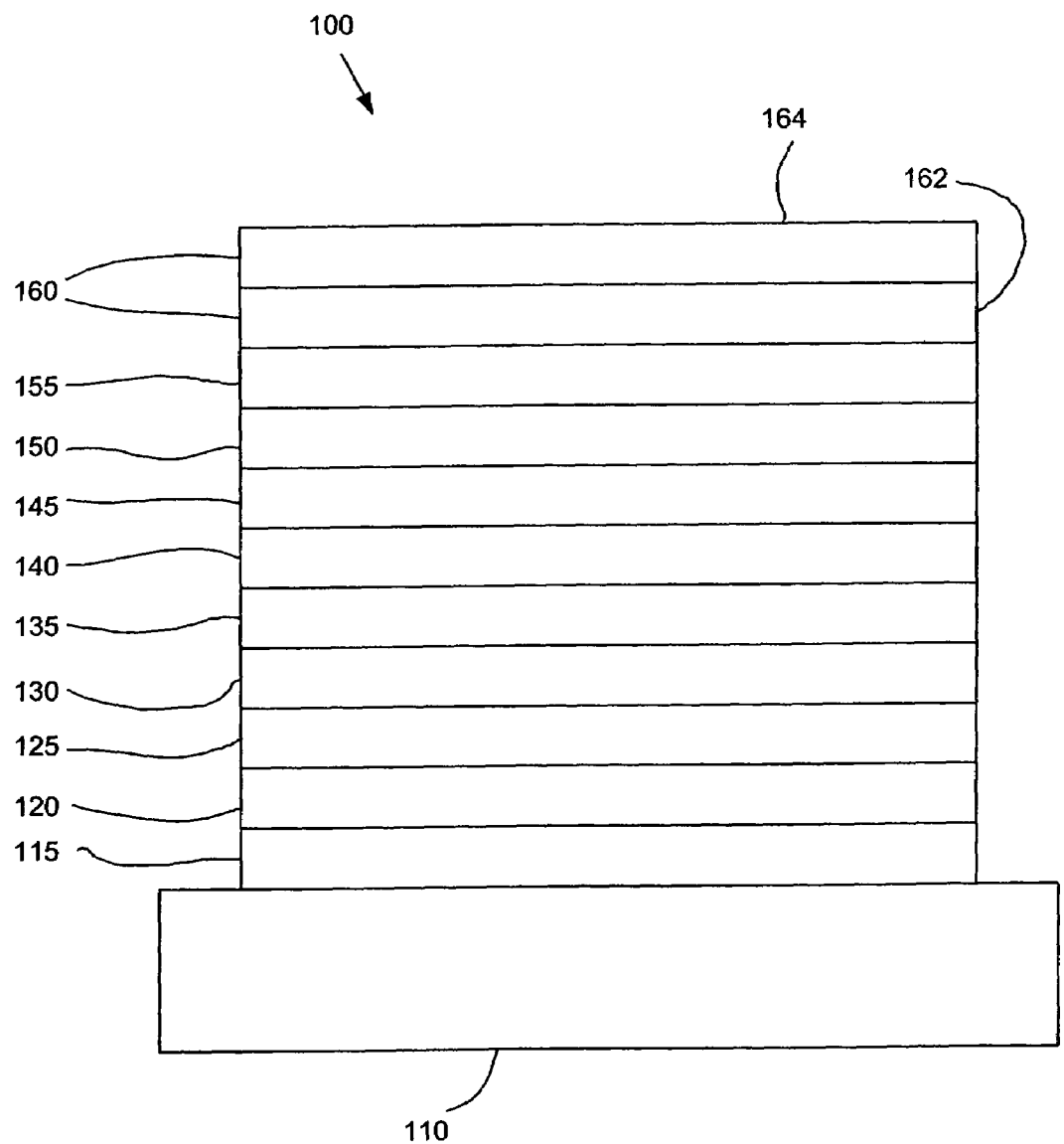
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. 4,4'-Bis[N-(1-naphthyl)-N-phenyl-amino]biphenyl (α-NPD) and as N,N'-diphenyl-N,N'-bis(3-methylphenyl)1-1'biphenyl-4,4'diamine (TPD) are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Most preferably, the electron affinity of the charge carrying component of the electron transport layer is greater than the work function of the cathode material. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties. Blocking layers can serve one or more blocking functions. For example, a hole blocking layer can also serve as an exciton blocking layer. In some embodiments, the hole blocking layer does not simultaneously serve as an emissive layer in devices of the present invention. Although a blocking layer can include compounds that are capable of emitting, emission can occur in a separate emissive layer. Thus, in preferred embodiments, the blocking layer does not luminesce. Blocking layers can be thinner than carrier layers. Typical blocking layers have a thickness ranging from about 50 Å.

Devices of the present invention comprise at least one electron blocking layer. An electron blocking layers functions to confine electrons to specific regions of the light emitting devices. For example, device efficiency can be increased if electrons are prevented from migrating out of the emissive layer (EL). Electron blocking layers are comprised of materials that have difficulty acquiring electrons (i.e., are relatively difficult to reduce). In the context of a light emitting device, electron blocking layers are preferably more difficult to reduce than the adjacent layer from which electrons migrate. A material that is more difficult to reduce than another material generally has a higher LUMO energy level. As an example, electrons originating from the cathode and migrating into an EL layer can be blocked from exiting the EL (on the anode side) by placing a blocking layer adjacent to the anode side of the EL where the blocking layer has a LUMO energy level higher than the LUMO energy level of the EL. Larger differences in LUMO energy levels correspond to better electron blocking ability. The LUMO of the materials of the blocking layer are preferably at least about 300 meV, or more, above the LUMO level of an adjacent layer in which holes are to be confined. In some embodiments, the LUMO of the materials of the blocking layer can be at least about 200 meV above the LUMO level of an adjacent layer in which holes are to be confined.

In some embodiments, the layer in which electrons are to be confined can comprise more than one material, such as a host material (matrix) and a dopant. In this case, an EBL preferably has a LUMO energy level that is higher than the material of the adjacent layer which carries the majority of negative charge (e.g., either the host or dopant having the lowest LUMO energy level). For example, an emissive layer can include a host material having a deeper LUMO energy level than the dopant. In this case, the host can be the principle electron transporter of the emissive layer. In such embodiments, the LUMO energy level of the EBL can be higher than the host material and lower than that of the dopant. Similarly, if the dopant served as the primary carrier of electrons, then the EBL preferably has a higher LUMO than the dopant.

Electron blocking layers are also preferably good hole injectors. Accordingly, the HOMO energy level of the EBL is preferably close to the HOMO energy level of the layer in which electrons are to be confined. It is preferable that differences in HOMO energy levels between the two layers is less than the differences in LUMO energies, leading to a lower barrier for migration of holes across the interface than for the migration of electrons form the emissive layer into the electron blocking layer. Electron blocking layers that are also good hole injectors typically have smaller energy barriers to hole injection than for electron leakage. Accordingly, the difference between the HOMO energies of the EBL and the layer in which electrons are to be confined (corresponding to an hole injection energy barrier) is smaller than the difference in their LUMO energies (i.e., electron blocking energy barrier).

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
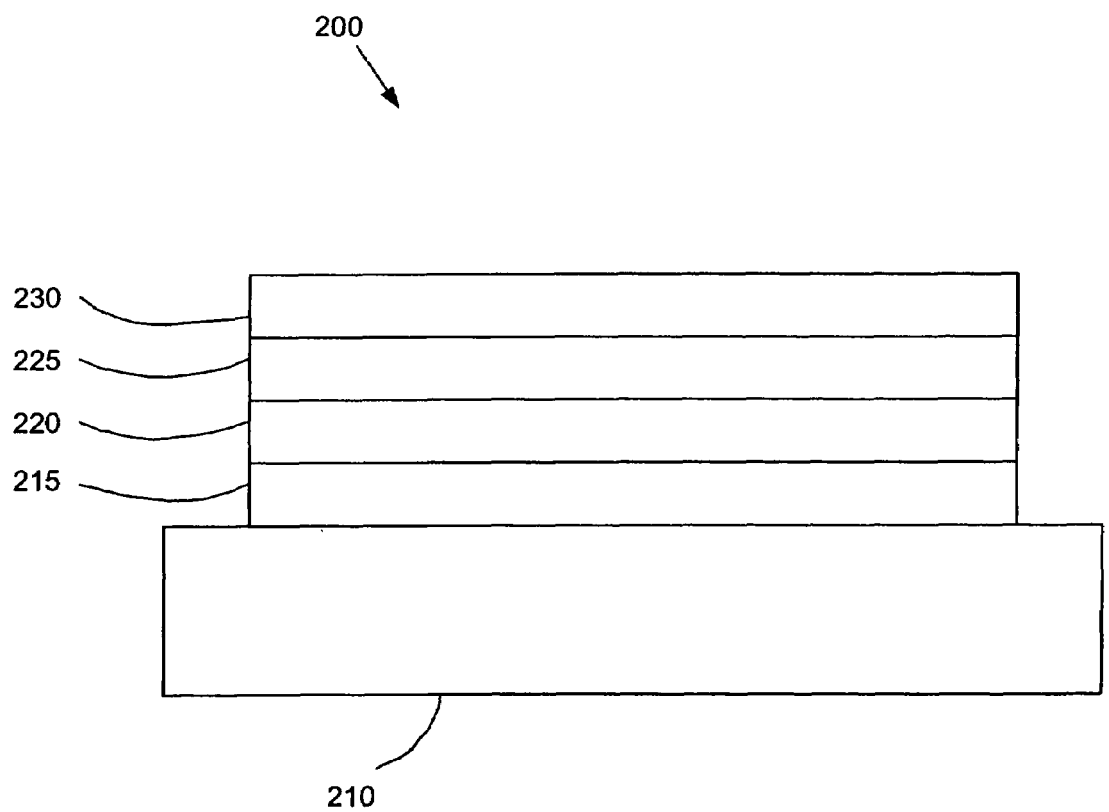
FIG. 2 shows an inverted organic light emitting device that does not have a separate electron transport layer.
Figure 3:
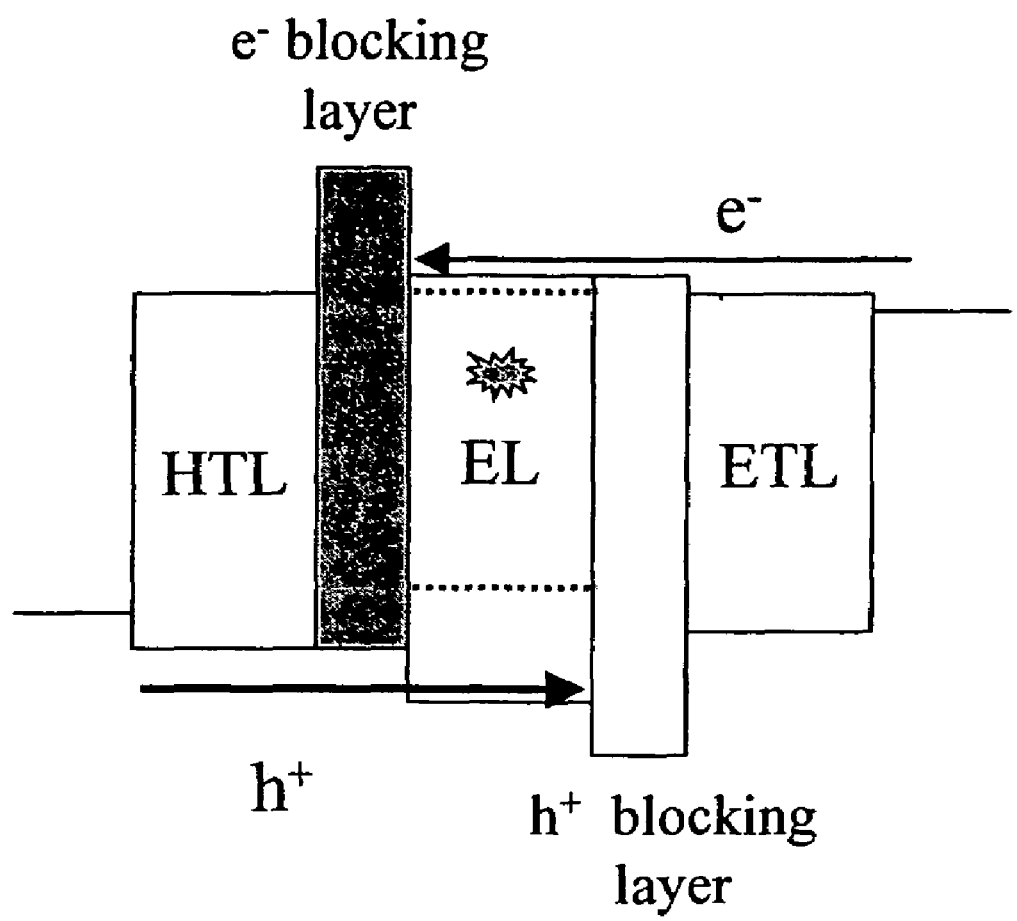
FIG. 3 shows a schematic representation of the energy levels of one embodiment of a device according to the present invention wherein the device has a hole transporting layer (HTL), an electron blocking layer, an emissive layer (EL), a hole blocking layer, and an electron transporting layer (ETL).

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as inkjet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

As used herein, "solution processible" means capable of being dissolved, dispersed, or transported in and/or deposited from a liquid medium, either in solution or suspension form.

The devices of the present invention comprise at least one electron blocking layer which functions to confine electrons to specific regions of the light emitting devices. The energy of OLED emission is may be close to the band-gap of HTL materials. The HOMO energy of the blue phosphorescent dopants is typically well below those of the standard hole transporting materials. Additionally, the LUMO level of the dopant or matrix in the emissive layer is often low enough to be a good electron transporter. As a result, in the absence of an electron blocking layer, a voltage dependent emission from the HTL may be observed, with a concurrent reduction in OLED efficiency. The electron blocking layer is advantageously disposed between the emissive layer and the hole transporting layer in order to confine the electrons to the emissive layer. The material for the electron blocking layer should have a LUMO level that is high enough to block electrons. Thus, the electron blocking layer should have several characteristics: a high triplet energy, a LUMO level high enough to prevent electron migration from the emissive layer, a HOMO energy that is close to HTL, and the material should be sublimable, forming uniform glassy films.

The devices of the present invention comprise an electron blocking layer, wherein the electron blocking layer comprises a material of the formula I

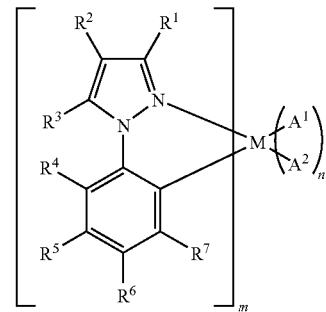

wherein M is a metal;
each $A^1$ and $A^2$ is, independently, a monodentate ligand; or $A^1$ and $A^2$ are covalently joined together to form a bidentate ligand;
each of $R^1$, $R^2$, $R^3$, $R^4$, $R^5$, $R^6$, and $R^7$ is, independently, H, alkyl, alkenyl, alkynyl, alkylaryl, CN, $CF_3$, $C_xF_{2x+1}$, trifluorovinyl, $CO_2R$, C(O)R, $NR_2$, $NO_2$, OR, halo, aryl, heteroaryl, substituted aryl, substituted heteroaryl or a heterocyclic group, and additionally, or alternatively, any one or more of $R^1$ and $R^2$, or $R^2$ and $R^3$, or $R^3$ and $R^4$, or $R^4$ and $R^5$, or $R^5$ and $R^6$, or $R^6$ and $R^7$ together form, independently, a fused 5- to 6-member cyclic group, wherein said cyclic group is cycloalkyl, cycloheteroalkyl, aryl, or heteroaryl, and wherein the fused 5- to 6-member cyclic group cyclic group may be optionally substituted with one or more of alkyl, alkenyl, alkynyl, alkylaryl, CN, $CF_3$, $C_xF_{2x+1}$, trifluorovinyl, $CO_2R$, C(O)R, $NR_2$, $NO_2$, OR, halo;
each R is independently H, alkyl, alkenyl, alkynyl, alkylaryl, and aryl;
m is 1, 2, or 3; and
n is 0, 1, or 2,
wherein m+n equals 3.

In one embodiment of the invention, $A^1$ and $A^2$ are each a monodentate ligand. Monodentate ligands $A^1$ and $A^2$ can include any ligand capable of coordinating to a metal atom through one atom. Numerous monodentate ligands are known to those skilled in the art and many suitable examples are provided in Cotton and Wilkinson, Advanced Inorganic Chemistry, Fourth Ed., John Wiley & Sons, New York, 1980, which is incorporated herein by reference in its entirety. In some embodiments, the monodentate ligands can include F, Cl, Br, I, CO, CN, CN(R), $SR^{11}$ SCN, OCN, $P(R^{11})_3$, $P(OR^{11})_3$, $N(R^{11})_3$, NO, $N_3$, or a nitrogen-containing heterocycle optionally substituted by one or more substituents. The phrase "nitrogen-containing heterocycle," as used herein refers to any heterocyclic group containing at least one nitrogen atom. Nitrogen-containing heterocycles can be saturated or unsaturated and include pyridine, imidazole, pyrrolidine, piperidine, morpholine, pyrimidine, pyrazine, pyridazine, pyrrole, 1,3,4-triazole, teterzole, isoxazole, thizole, derivatives thereof and the like. In further embodiments, one of $A^1$ and $A^2$ is a neutral monodentate ligand and the other of $A^1$ and $A^2$ is monoanionic, i.e., $A^1$ and $A^2$ have a combined charge of (−1). For example, $A^1$ can be chloro and $A^2$ can be pyridyl.

In a preferred embodiment, $A^1$ and $A^2$ together represent a bidentate ligand. Numerous bidentate ligands are known to those skilled in the art and many suitable examples are provided in Cotton and Wilkinson, Advanced Inorganic Chemistry, Fourth Ed., John Wiley & Sons, New York, 1980, which is incorporated herein by reference in its entirety. In some embodiments, bidentate ligands are monoanionic. Suitable bidentate ligands include acetylacetonate (acac), picolinate (pic), salicylidene, amino acids, salicylaldehydes, and iminoacetonates, and derivatives thereof. Preferred bidentate ligands include acetylacetonate (acac) and picolinate (pic), and derivatives thereof. The preferred bidentate ligands have the following structures:

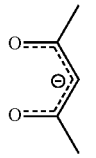

(acac)

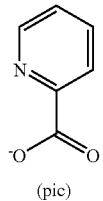

(pic)

wherein the acac or the pic may be substituted at one or more of the carbon atoms with one or more of alkyl, alkenyl, alkynyl, alkylaryl, CN, $CF_3$, $CO_2R$, $C(O)R$, $NR_2$, $NO_2$, OR, halo, aryl, and heteroaryl. A preferred derivative of acac that may be used as a bidentate ligand is dpm:

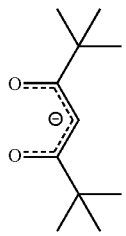

dpm

The best choice for the $A^1$, $A^2$ ligand(s) will have a high triplet energy. This will give the resulting metal complex the highest possible triplet energy and the best exciton blocking character. While a low triplet energy ligand (e.g. 8-hydroxyquinolate has a triplet energy of 650 nm or 1.9 eV) will limit the exciton blocking abilities of a material it may not affect the materials ability to act as an electron blocker.

A further preferred embodiment, invention comprises the compound of the formula I in which m is 2 and n is 1, to give a compound of the formula II

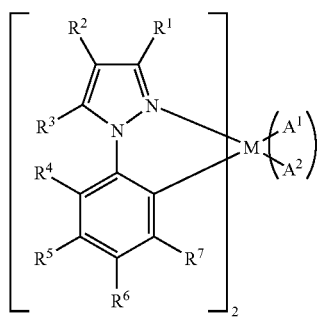

II wherein M, $R^1$, $R^2$, $R^3$, $R^4$, $R^5$, $R^6$, $R^7$, $A^1$, and $A^2$ are as described for the compound of the formula I.

According to compounds of the present invention, M can be any metal atom, including transition metals, lanthanides, actinides, main group metals, alkali metals and alkaline earth metals. In a preferred embodiment, M is a transition metal. In more preferred embodiments, M is a second or third row transition metal. In some embodiments, M is Ir, Os, Pt, Pb, Re, or Ru. In particularly preferred embodiments, M is Ir.

Another embodiment of the invention comprises the compound of the formula I in which m is 3 and n is 0, resulting in a compound of the formula III

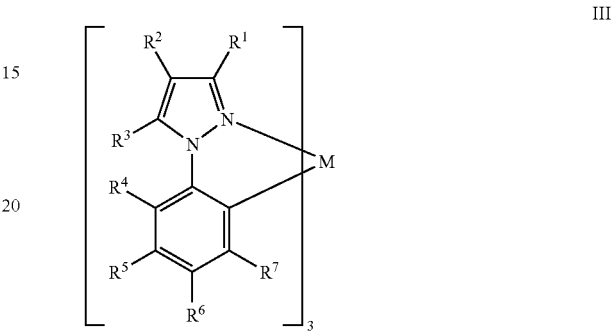

III wherein M is a metal;
each of $R^1$, $R^2$, $R^3$, $R^4$, $R^5$, $R^6$, and $R^7$ is, independently, H, alkyl, alkenyl, alkynyl, alkylaryl, CN, $CF_3$, $C_xF_{2x+1}$, trifluorovinyl, $CO_2R$, $C(O)R$, $NR_2$, $NO_2$, OR, halo, aryl, heteroaryl, substituted aryl, substituted heteroaryl or a heterocyclic group, and additionally, or alternatively, any one or more of $R^1$ and $R^2$, or $R^2$ and $R^3$, or $R^3$ and $R^4$, or $R^4$ and $R^5$, or $R^5$ and $R^6$, or $R^6$ and $R^7$ together form, independently, a fused 5- to 6-member cyclic group, wherein said cyclic group is cycloalkyl, cycloheteroalkyl, aryl, or heteroaryl, and wherein the fused 5- to 6-member cyclic group cyclic group may be optionally substituted with one or more of alkyl, alkenyl, alkynyl, alkylaryl, CN, $CF_3$, $C_xF_{2x+1}$, trifluorovinyl, $CO_2R$, $C(O)R$, $NR_2$, $NO_2$, OR, halo; and
each R is independently H, alkyl, alkenyl, alkynyl, alkylaryl, and aryl.

One embodiment of the invention comprises the compound of the formula III in which $R^1$, $R^2$, $R^3$, $R^4$, $R^5$, $R^6$, and $R^7$ are each H for use as electron blocking materials. For example, the unsubstituted iridium phenylpyrazole complex (e.g. Ir(ppz)$_3$) is an effective electron blocker in OLEDs.

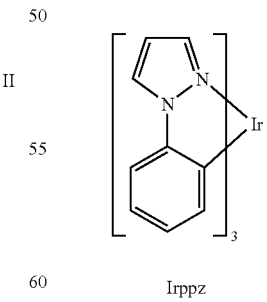

Irppz

Figure 4:
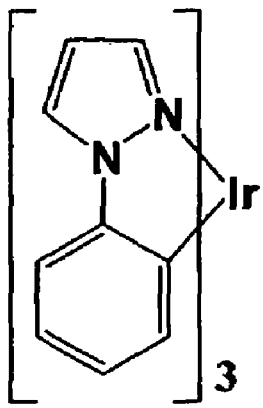
FIG. 4 shows the structures of tris(phenylpyrazole) iridium (Irppz) and Iridium(III) bis(1-phenylpyrazolato,N, C2') (2,2,6,6-tetramethyl-3,5-heptanedionato-O,O) ($ppz_2Ir(dpm)$)
Figure 4:
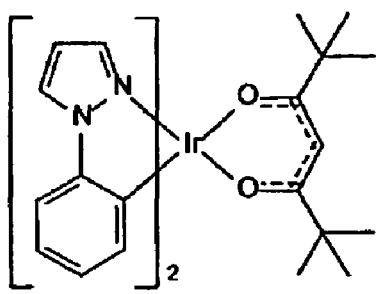

The estimated HOMO and LUMO levels of Irppz are summarized in FIG. 4. The energy levels scheme suggests that Irppz should make an excellent EBL.

Unfortunately, devices prepared with Ir(ppz)$_3$ generally have short device lifetimes. The device instability appears to be due to poor stability of the complex, during device operation. A paper by Pavlik ("Phototransposition Chemistry of 1-Phenylpyrazole. Experimental and Computational Studies" James W. Pavlik, Robert E. Connors, Douglas S. Burns, and Edyth M. Kurzweil, *Journal of the American Chemical Society*, 1993, vol. 115, 7645-7652) discusses the photochemical isomerization of N-phenylpyrazole and methyl-N-phenylpyrazoles to phenyl-imidazoles. The quantum efficiency of the isomerization reaction of N-phenylpyrazole is over 0.2 and increases to over 0.6 for compounds 4-methyl-N-phenylpyrazole and 5-methyl-N-phenylpyrazole. The methyl substitution in 3-methyl-N-phenylpyrazole leads to a decrease in the isomerization efficiency to less than 0.01. Without being limited by theory, it is believed that a similar isomerization may occur for Ir(ppz)$_3$ and similar metal phenylpyrazole electron blockers. Such an isomerization of the N-phenylpyrazole to a phenyl-imidazole ligand, or a ring opened structure could lead to decomposition of the metal phenylpyrazole electron blocker. Substitution on the N-phenylpyrazole ligand, particularly at $R^1$, may lead to a marked increase in the stability of metal phenylpyrazole electron blockers.

Thus, in a preferred embodiment, the devices of the present invention comprise an electron blocking layer, wherein the electron blocking layer comprises a compound of the formula II or formula III wherein $R^1$ is a substituent other than H. In a further preferred embodiment, $R^1$ is alkyl or aralkyl. In a particularly preferred embodiment, $R^1$ is methyl.

In a further preferred embodiment, the devices of the present invention comprise an electron blocking layer, wherein the electron blocking layer comprises a material of the formula II or formula III wherein $R^2$ and $R^3$ are H to give a compound of the formula II$_a$ or formula III$_a$

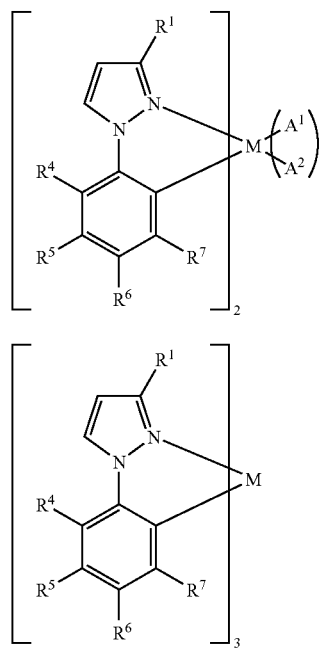

wherein M is a metal;
  each $A^1$ and $A^2$ is, independently, a monodentate ligand; or $A^1$ and $A^2$ are covalently joined together to form a bidentate ligand;

$R^1$ is alkyl, alkenyl, alkynyl, alkylaryl, CN, CF$_3$, C$_x$F$_{2x+1}$, trifluorovinyl, CO$_2$R, C(O)R, NR$_2$, NO$_2$, OR, halo, aryl, heteroaryl, substituted aryl, substituted heteroaryl or a heterocyclic group;

each of $R^4$, $R^5$, $R^6$, and $R^7$ is, independently, H, alkyl, alkenyl, alkynyl, alkylaryl, CN, CF$_3$, C$_x$F$_{2x+1}$, trifluorovinyl, CO$_2$R, C(O)R, NR$_2$, NO$_2$, OR, halo, aryl, heteroaryl, substituted aryl, substituted heteroaryl or a heterocyclic group, and additionally, or alternatively, any one or more of $R^4$ and $R^5$, or $R^5$ and $R^6$, or $R^6$ and $R^7$ together form, independently, a fused 5- to 6-member cyclic group, wherein said cyclic group is cycloalkyl, cycloheteroalkyl, aryl, or heteroaryl, and wherein the fused 5- to 6-member cyclic group cyclic group may be optionally substituted with one or more of alkyl, alkenyl, alkynyl, alkylaryl, CN, CF$_3$, C$_x$F$_{2x+1}$, trifluorovinyl, CO$_2$R, C(O)R, NR$_2$, NO$_2$, OR, halo; and each R is independently H, alkyl, alkenyl, alkynyl, alkylaryl, and aryl.

In a preferred embodiment, the devices of the present invention comprise an electron blocking layer, wherein the electron blocking layer comprises a compound of the formula II$_a$ or formula III$_a$, wherein $R^1$ is alkyl or aralkyl. In a particularly preferred embodiment, $R^1$ is methyl.

While the present invention has been illustrated for $R^1$-substituted N-phenylpyrazole compounds that have a reduced isomerization as compared with unsubstituted N-phenylpyrazole compounds, it is believed that compounds substituted instead at the $R^2$ and/or $R^3$ position might also have reduced isomerization. Thus, other embodiments of the present invention may include electron blocking layers comprising a compound of the formula II$_a$ or formula III$_a$, wherein $R^1$ is hydrogen and at least one of $R^2$ or $R^3$ is other than hydrogen, in particular, at least one of $R^2$ or $R^3$ is alkyl or aralkyl.

In addition, while the present invention has been illustrated for substituted N-phenylpyrazole compounds that have a reduced isomerization as compared with unsubstituted N-phenylpyrazole compounds, wherein Ir is a particularly preferred metal, other metals may also be used wherein the chemical compound is represented by the following partial structure:

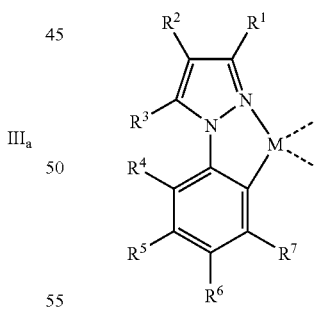

wherein M is a metal;
  each of $R^1$, $R^2$, $R^3$, $R^4$, $R^5$, $R^6$, and $R^7$ is, independently, H, alkyl, alkenyl, alkynyl, alkylaryl, CN, CF$_3$, C$_x$F$_{2x+1}$, trifluorovinyl, CO$_2$R, C(O)R, NR$_2$, NO$_2$, OR, halo, aryl, heteroaryl, substituted aryl, substituted heteroaryl or a heterocyclic group, and additionally, or alternatively, any one or more of $R^1$ and $R^2$, or $R^2$ and $R^3$, or $R^3$ and $R^4$, or $R^4$ and $R^5$, or $R^5$ and $R^6$, or $R^6$ and $R^7$ together form, independently, a fused 5- to 6-member cyclic group, wherein said cyclic group is cycloalkyl, cycloheteroalkyl, aryl, or heteroaryl, and wherein the fused 5- to 6-member cyclic group cyclic group may be optionally substituted with one or more of alkyl, alkenyl, alkynyl, alkylaryl, CN, $CF_3$, $C_xF_{2x+1}$, trifluorovinyl, $CO_2R$, C(O)R, $NR_2$, $NO_2$, OR, halo; and each R is independently H, alkyl, alkenyl, alkynyl, alkylaryl, and aryl.

The term "halo" or "halogen" as used herein includes fluorine, chlorine, bromine and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted with one or more substituents selected from halo, CN, $CO_2R$, C(O)R, $NR_2$, cyclic-amino, $NO_2$, and OR.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted with one or more substituents selected from halo, CN, $CO_2R$, C(O)R, $NR_2$, cyclic-amino, $NO_2$, and OR.

The term "alkenyl" as used herein contemplates both straight and branched chain alkene radicals. Preferred alkenyl groups are those containing two to fifteen carbon atoms. Additionally, the alkenyl group may be optionally substituted with one or more substituents selected from halo, CN, $CO_2R$, C(O)R, $NR_2$, cyclic-amino, $NO_2$, and OR.

The term "alkynyl" as used herein contemplates both straight and branched chain alkyne radicals. Preferred alkyl groups are those containing two to fifteen carbon atoms. Additionally, the alkynyl group may be optionally substituted with one or more substituents selected from halo, CN, $CO_2R$, C(O)R, $NR_2$, cyclic-amino, $NO_2$, and OR.

The term "alkylaryl" as used herein contemplates an alkyl group which has as a substituent an aromatic group. Additionally, the alkylaryl group may be optionally substituted on the aryl with one or more substituents selected from halo, CN, $CO_2R$, C(O)R, $NR_2$, cyclic-amino, $NO_2$, and OR.

The term "heterocyclic group" as used herein contemplates non-aromatic cyclic radicals. Preferred heterocyclic groups are those containing 3 or 7 ring atoms which includes at least one hetero atom, and includes cyclic amines such as morpholino, piperdino, pyrrolidino, and the like, and cyclic ethers, such as tetrahydrofuran, tetrahydropyran, and the like.

The term "aryl" or "aromatic group" as used herein contemplates single-ring aromatic groups and polycyclic ring systems. The polycyclic rings may have two or more rings in which two carbons are common by two adjoining rings (the rings are "fused") wherein at least one of the rings is aromatic, e.g., the other rings can be cycloalkyls, cycloalkenyls, aryl, heterocycles and/or heteroaryls.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles and/or heteroaryls.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

| | |
|---|---|
| CBP: | 4,4'-N,N-dicarbazole-biphenyl |
| m-MTDATA | 4,4',4''-tris(3-methylphenylphenlyamino)triphenylamine |
| $Alq_3$: | 8-tris-hydroxyquinoline aluminum |
| Bphen: | 4,7-diphenyl-1,10-phenanthroline |
| n-BPhen: | n-doped BPhen (doped with lithium) |
| $F_4$-TCNQ: | tetrafluoro-tetracyano-quinodimethane |
| p-MTDATA: | p-doped m-MTDATA (doped with $F_4$-TCNQ) |
| $Ir(ppy)_3$: | tris(2-phenylpyridine)-iridium |
| $Ir(ppz)_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine. |
| ITO: | indium tin oxide |
| NPD: | naphthyl-phenyl-diamine |
| TPD: | N,N'-bis(3-methylphenyl)-N,N'-bis-(phenyl)-benzidine |
| BAlq: | aluminum(III)bis(2-methyl-8-quinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |
| PEDOT:PSS: | an aqueous dispersion of poly(3,4-ethylenedioxythiophene) with polystyrenesulfonate (PSS) |
| $ppz_2Ir(dpm)$: | Iridium(III)bis(1-phenylpyrazolato,N,C2')(2,2,6,6-tetramethyl-3,5-heptanedionato-O,O |
| FPt1: | Platinum(II)(2-(4',6'-difluorophenyl)pyridinato-N,C2')(2,4-pentanedionato-O,O) |
| FPt2: | Platinum(II)(2-(4',6'-difluorophenyl)pyridinato-N,C2')(2,6-dimethyl-3,5-heptanedionato-O,O) |

EXPERIMENTAL

Specific representative embodiments of the invention will now be described, including how such embodiments may be made. It is understood that the specific methods, materials, conditions, process parameters, apparatus and the like do not necessarily limit the scope of the invention.

Where available, solvents and reagents were purchased from Aldrich Chemical Company. The reagents were of the highest purity and used as received.

The ligand 2-(2,4-difluorophenyl)pyridine ($F_2$ppy) was prepared by Suzuki coupling 2,4-difluorophenylboronic acid and 2-bromopyridine (Aldrich). The Pt(II) μ-dichloro-bridged dimer [($F_2$ ppy)$_2$Pt(μ-Cl)$_2$Pt($F_2$ppy)$_2$] was prepared by a modified method of Lewis. (Lohse, O. et al. *Synlett.* 1999, 1, 45-48). The dimer was treated with 3 equivalents of the chelating diketone ligand and 10 equivalents of $Na_2CO_3$. 2,6-dimethyl-3,5-heptanedione, and 6-methyl-2,4-heptanedione were purchased from TCI. 3-Ethyl-2,4-pentandione was purchased from Aldrich. The solvent was removed under reduced pressure, and the compound purified chromatographically. The product was recrystallized from dichloromethane/methanol and then sublimed.

Irppz was prepared by dissolving Ir(acac)$_3$ (3.0 g) and 1-phenylpyrazole (3.1 g) in 100 ml glycerol and refluxing for 12 hours under and inert atmosphere. After cooling the product was isolated by filtration and washed with several portions of distilled water, methanol, ether and hexanes and then vacuum dried. The crude product was then sublimed in a temperature gradient of 220-250° C. to give a pale yellow product (yield 58%).

(ppz)2Ir(dpm) was prepared by the following procedure. [(ppz)$_2$IrCl]$_2$, was treated with an excess of 2,2,5,5-tetramethyl-heptanedione (i.e. dpm, 3 equivalents), and sodium carbonate (10 equivalents) in 2-ethoxyethanol. The slurry was refluxed was refluxed under an inert gas atmosphere for 12 hours. After cooling to room temperature, the cream colored precipitate was filtered off and was washed with water, followed by 2 portions of ether and hexane. The crude product was flash chromatographed using a silica:dichloromethane column, and sublimed to give a colorless solid. see *Synthesis and Characterization of Phosphorescent Cyclometalated Iridium Complexes*. Sergey Lamansky, Peter Djurovich, Drew Murphy, Feras Abdel-Razaq, Raymond Kwong, Irina Tsyba, Manfred Bortz, Becky Mui, Robert Bau, Mark E. Thompson, *Inorganic Chemistry*, 2001, 40(7), 1704-1711.

mCP was prepared by the palladium-catalyzed cross coupling of aryl halides and arylamines. (T. Yamamoto, M. Nishiyama, Y. Koie *Tet. Lett.*, 1998, 39, 2367-2370).

Device Fabrication

Prior to device fabrication, indium tin oxide (ITO) on glass was patterned as 2 mm wide stripes (sheet resistance 20 Ω/□) The substrates were cleaned by sonication in soap solution, rinsing with deionized water, boiled in trichloroethylene, acetone and ethanol for 3-4 min in each solvent. After the cleaning procedure, the substrates were dried under an N$_2$ flow followed by UV ozone treatment for 10 min.

Organic layers of the OLEDs were sequentially deposited by thermal evaporation from resistively heated tantalum boats onto the substrates, at room temperature, at a base pressure of ~3-4×10$^{-6}$ Torr, at 2.5 Å/s. The rate of a single-component layer was controlled with one Inficon thickness monitor located close to the substrate. For the two-component emissive layer the rate of the dopant was controlled with an additional crystal monitor located close to the dopant evaporation source. The additional monitor was not exposed to the major flow of the host, which allowed increasing the precision of the dopant concentration.

After deposition of the organic films, the chamber was vented and a shadow mask with 2 mm wide stripes was put onto the substrates across the ITO strips. The cathode consisting of 10 Å LiF followed by 1000-1500 Å of aluminum was deposited at 0.3-0.4 Å/s for LiF and 3-4 Å/s for aluminum. The OLEDs were formed as 2×2 mm squares at the intersections of ITO anode and Al cathode stripes.

The devices were characterized in the air within 2 h of fabrication. Current-voltage measurements were made with a Keithley source meter (model 2400). Light intensity was measured using a Newport model 1835 optical power meter and 818-UV Newport detector. EL spectra were measured with a Photon Technology International fluorimeter.

EXAMPLE 1

Figure 5:
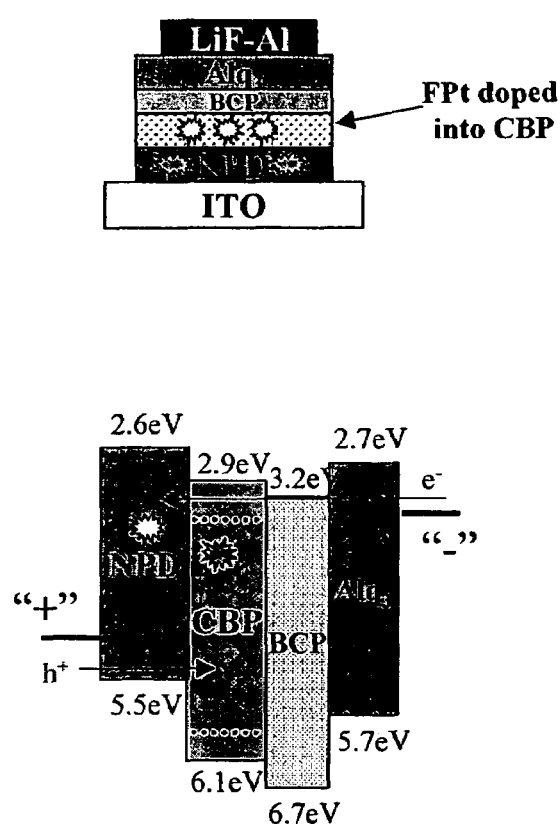
FIG. 5 shows (A) a device without an electron blocking layer having the device structure ITO/α-NPD/FPt2(8%):CBP/BCP/$Alq_3$/LiF—Al, and (B) a device with an electron blocking layer having the device structure ITO/α-NPD/Irppz/FPt2(8%):CBP/BCP/$Alq_3$/LiF—Al, as well as a schematic representation of the energy levels for each device.
Figure 5:
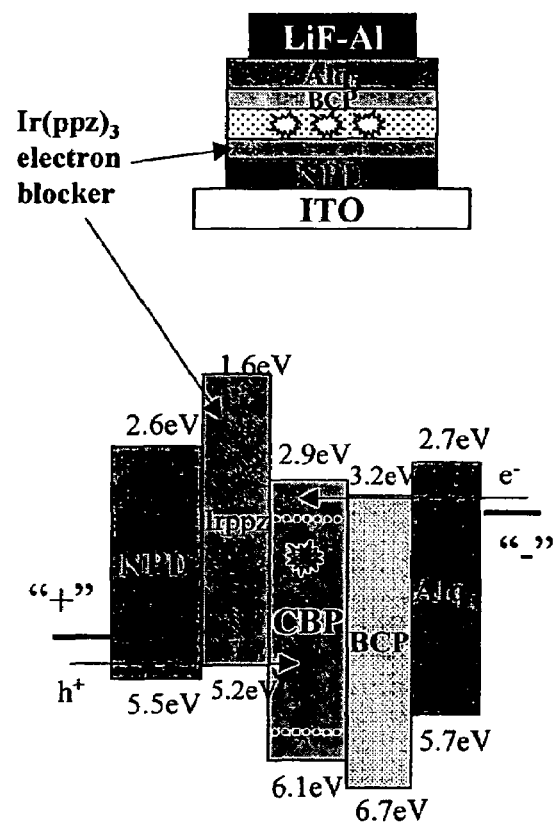
Figure 6:
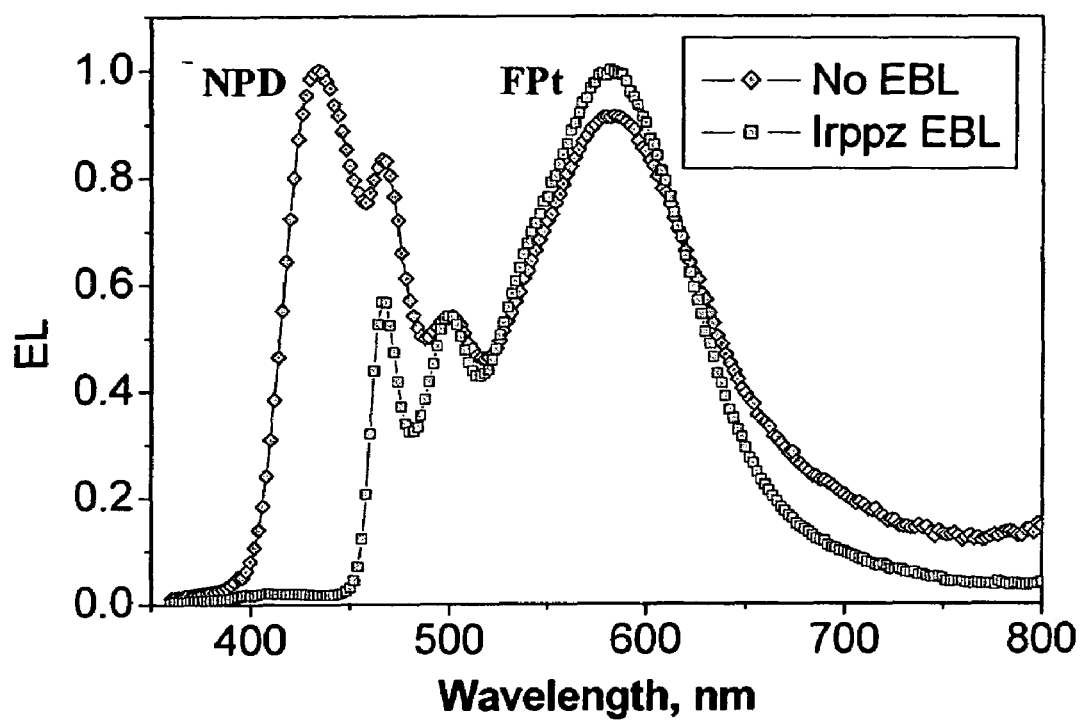
FIG. 6 shows the electroluminescent spectra at 10V for the devices of FIG. 5.

An OLED with the structure ITO/NPD(400 Å)/CBP:FPt2 8% (300 Å)/BCP(150 Å)/ALq$_3$(200 Å)/LiF(10 Å)/Al(1000 Å) was fabricated (FIG. 5A). The device had predominantly NPD emission in the spectrum due to electron leakage into HTL (FIG. 6). The EL spectrum was voltage dependent and did not give stable color. As a result a low device efficiency (~1%) was obtained.

EXAMPLE 2

A device was fabricated as described in example 1, except that a 200 Å thick electron-blocking layer of Ir(ppz)$_3$ was introduced between the HTL and the emissive layer (FIG. 5B). With the introduction of the Irppz EBL is to the FPt based WOLED structure, the electron leakage into the NPD layer is eliminated. The electroluminescent spectra of the single dopant WOLEDs (using 8 wt % FPt2 in CBP), with and without Irppz EBL, are shown in FIG. 6. The device having the Irppz electron blocking layer gives an EL spectrum consistent with only dopant emission (i.e. no NPD emission is observed at any bias level) leading to a voltage independent, high quality white emission. The quantum efficiency of the device with an Irppz blocking layer is nearly double that of the device with no EBL (peak efficiency=1.9%).

EXAMPLE 3

Figure 8:
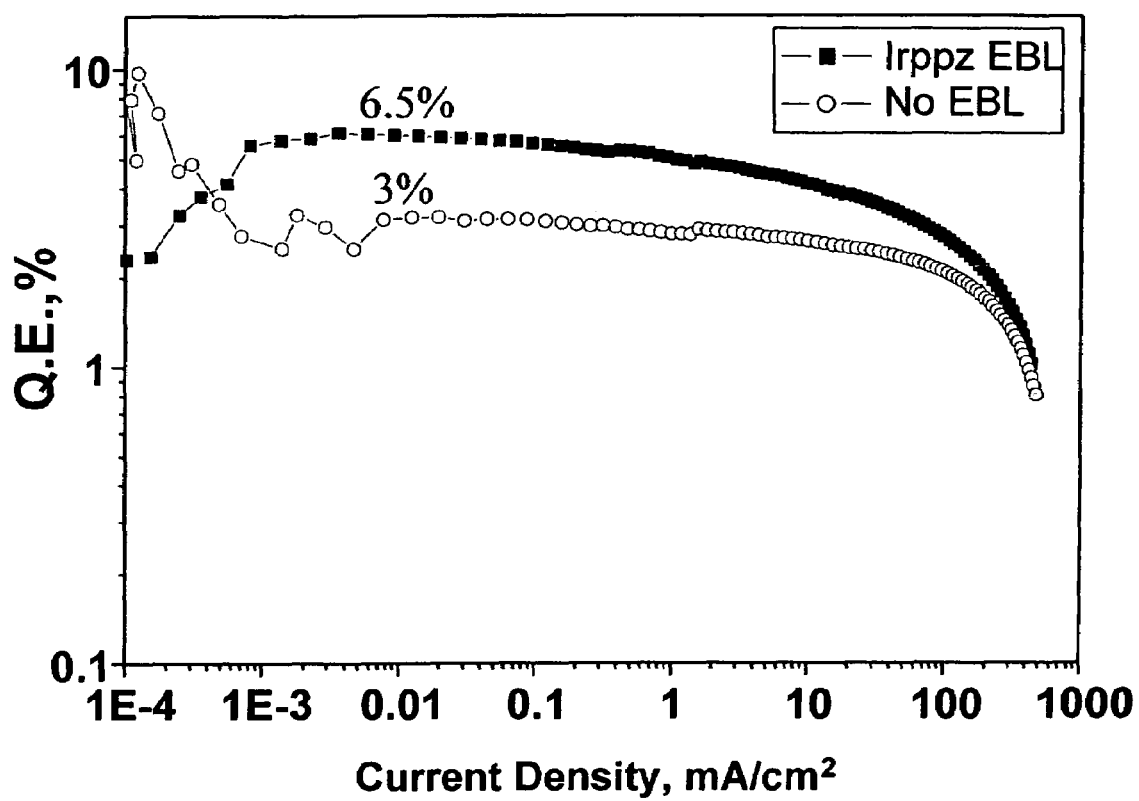
FIG. 8 shows the quantum efficiency vs current density for the device depicted in FIG. 7 and the related structure without the Irppz EBL.
Figure 9:
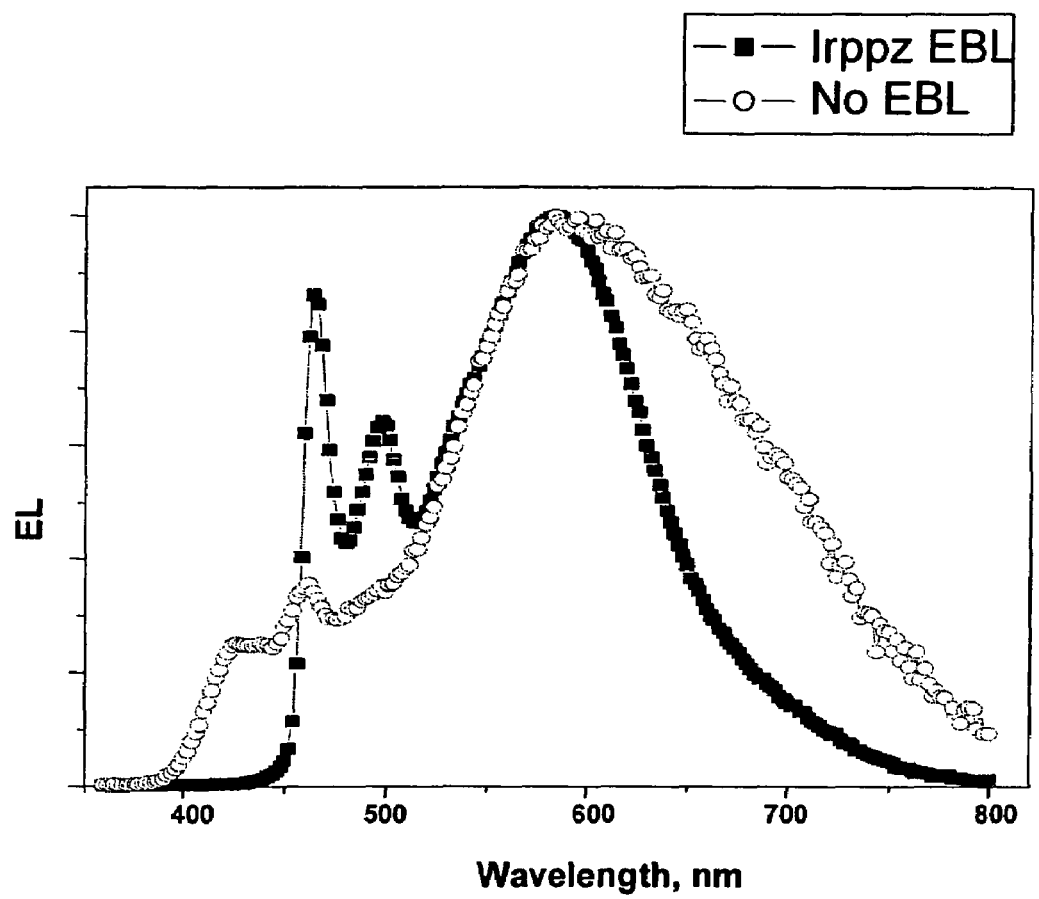
FIG. 9 shows the electroluminescent spectra for the WOLED depicted in FIG. 7 and the related structure without the Irppz EBL.

An OLED device with the structure ITO/NPD(400 Å)/mCP:FPt1 16% (300 Å)/BCP(150 Å)/Alq$_3$(200 Å)/LiF (10 Å)/Al(1000 Å) was fabricated. This device had a NPD emission in the spectrum due to electron leakage into HTL (FIG. 9). The EL spectrum was voltage dependent and did not give stable color. A device efficiency of 3% was obtained (FIG. 8).

EXAMPLE 4

Figure 7:
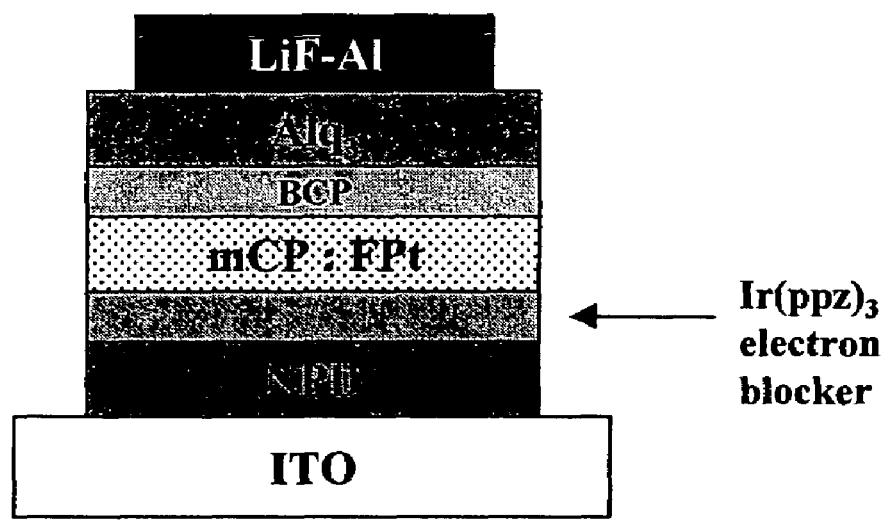
FIG. 7 shows a device having an electron blocking layer. The device has the device structure ITO/α-NPD/Irppz/mCP:FPt(16%)/BCP/$Alq_3$/LiF—Al.
Figure 10:
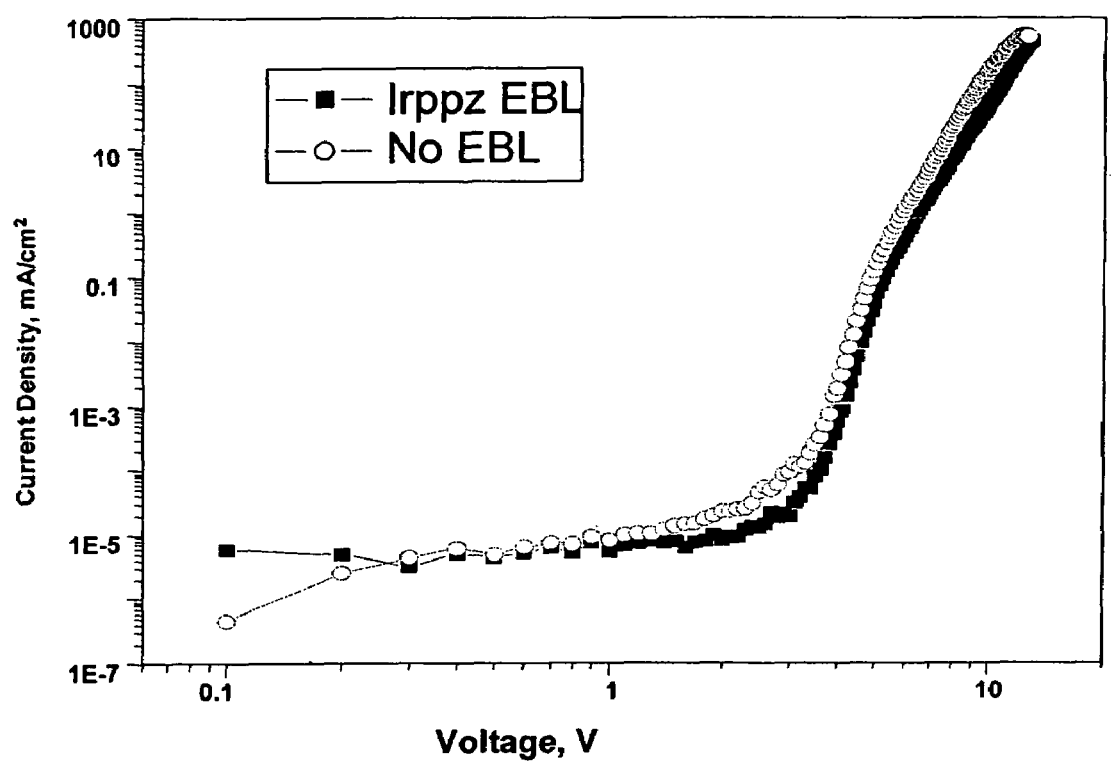
FIG. 10 shows plot of the current density vs. voltage for the WOLED depicted in FIG. 7 and the related structure without the Irppz EBL.
Figure 11:
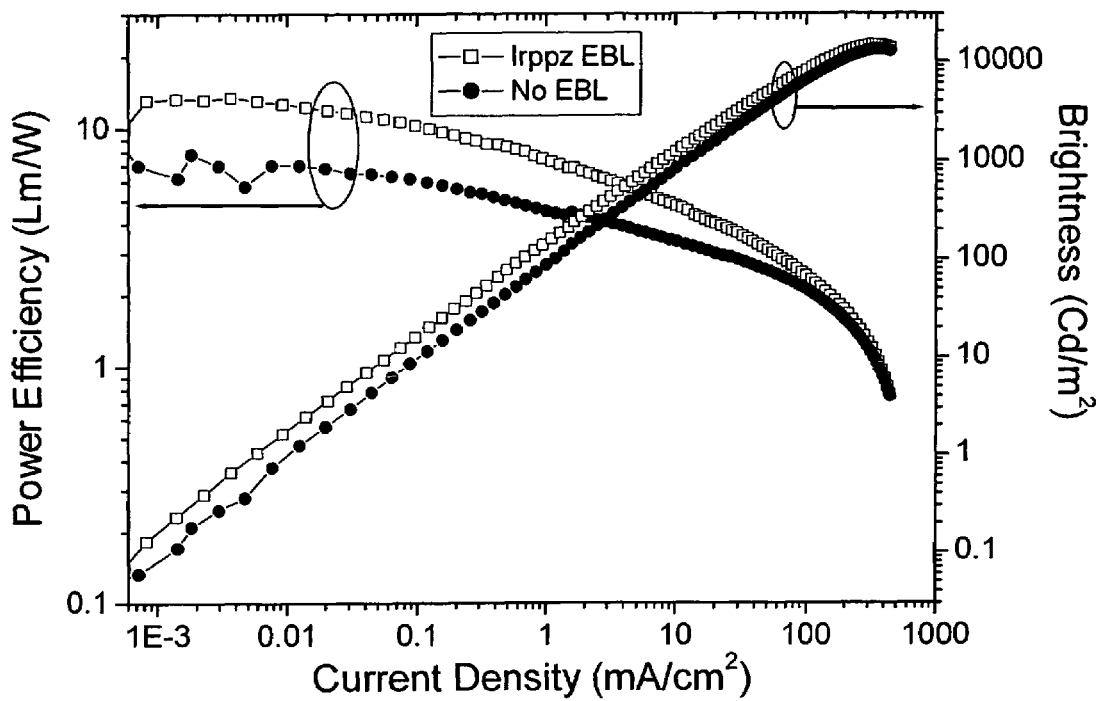
FIG. 11 shows the Lumens per watt and brightness vs. current density plots for the WOLED depicted in FIG. 7 and the related structure without the Irppz EBL.

A device was fabricated as described in example 3 except that a 200 Å thick electron-blocking layer of Ir(ppz)$_3$ was introduced between the HTL and the EL (FIG. 7). NPD emission was eliminated by the introduction of the EBL. The device efficiency increased to 6.5% (FIG. 8). The chart of the quantum efficiency shows that the over all OLED efficiency is 2 times greater for the device having the electron blocking layer compared to the device without the electron blocking layer. The EL spectra of this device and the device in example 3 are shown in FIG. 9. As seen in the electroluminescent spectra, without the electron blocking layer, emission occurs from both the HTL (α-NPD) and the emissive layer. For the device having an electron blocking layer, emission is confined to the doped emissive layer and emission from the α-NPD is not observed. The IV characteristics are nearly identical for the two devices (FIG. 10). This confirms that Ir(ppz)$_3$ EBL is a good hole-transporter and does not impede the current through the device.

EXAMPLE 5

Figure 12:
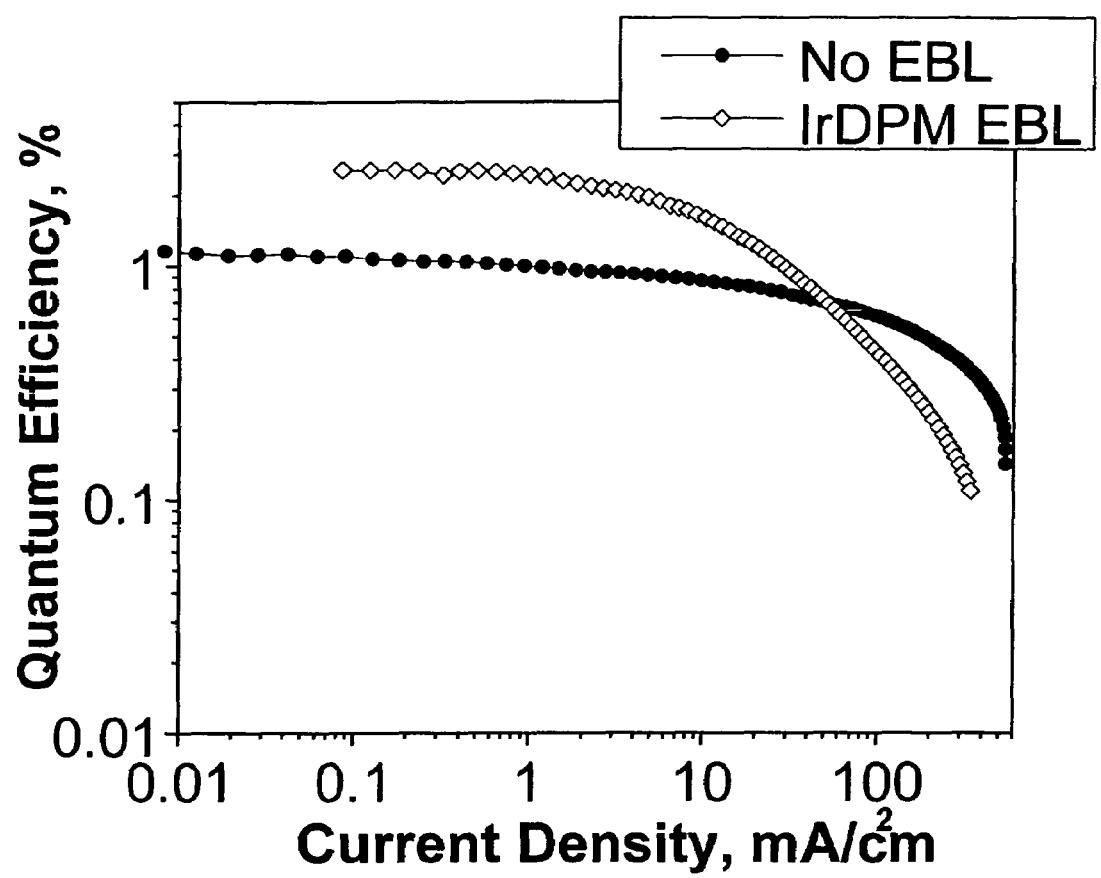
FIG. 12 shows the quantum efficiency vs current density for the device ITO/α-NPD/$(ppz)_2Ir(dpm)$/CBP:FPt1(6%)/BCP/$Alq_3$/LiF—Al and the related structure without the $(ppz)_2Ir(dpm)$ EBL.
Figure 13:
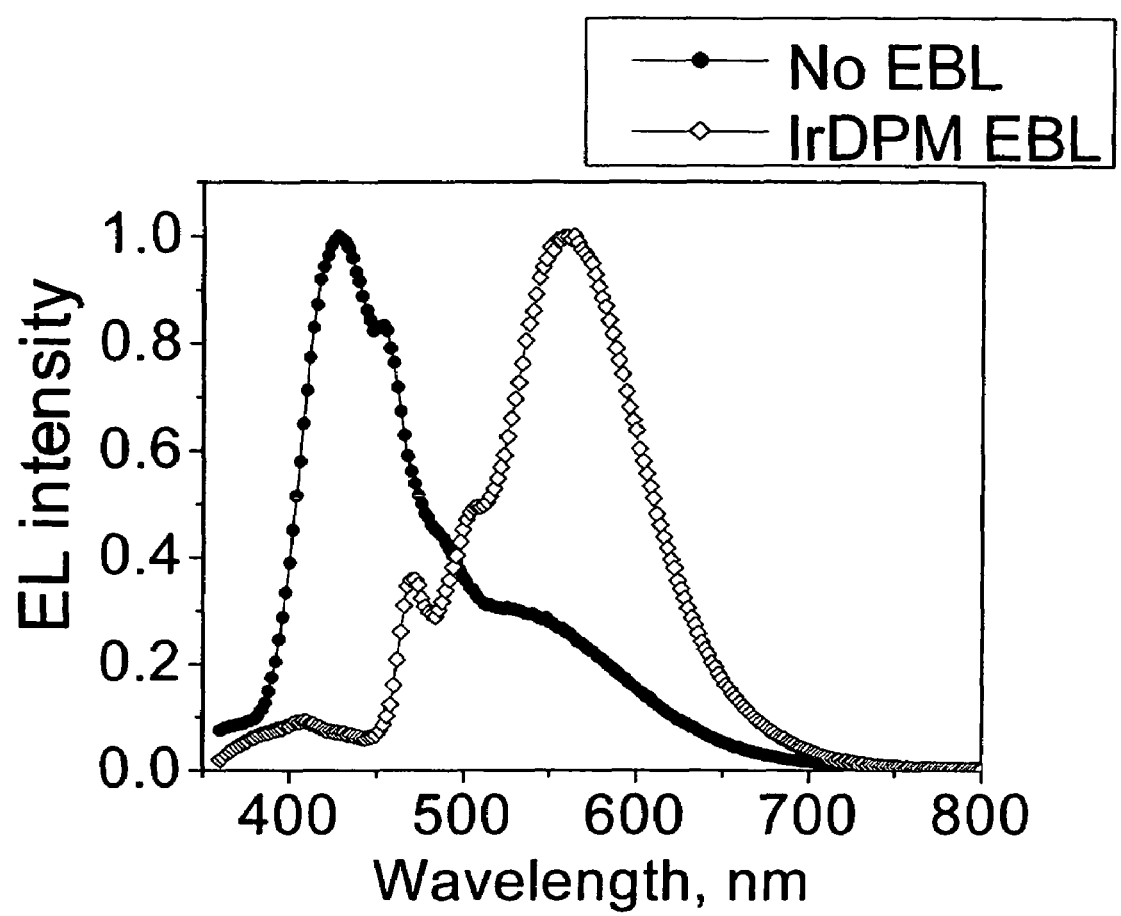
FIG. 13 shows the electroluminescent spectra for the devices of FIG. 12 at 10V.

An OLED with the structure ITO/NPD(400 Å)/CBP:FPt1 6% (300 Å)/BCP(150 Å)/AlLq$_3$(200 Å)/LiF(10 Å)/Al(1000 Å) was fabricated. It had predominantly NPD emission in the EL spectrum due to electron leakage (FIG. 13). As a result a low device efficiency (~1%) was obtained (FIG. 12)

EXAMPLE 6

Figure 14:
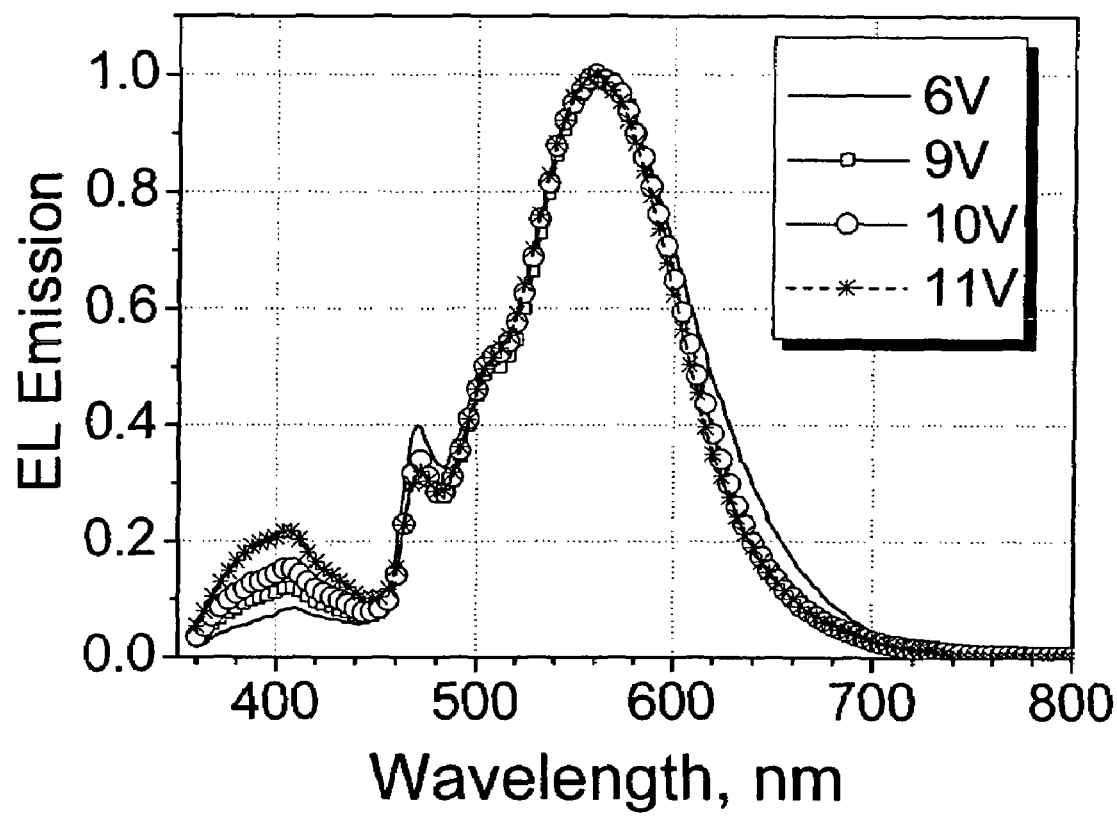
FIG. 14 shows the electroluminescent spectra for the device of FIG. 12 at various voltages.

A device was fabricated as described in example 5, except that a 200 Å thick electron-blocking layer of (ppz)$_2$Ir(dpm) was introduced between the HTL and the EL. The EL spectrum of this device contained only dopant (FPt) emission. (see FIG. 13). The efficiency of this device was almost 3 times higher (about 3%) due to recombination occurring only in the ELM (see FIG. 12). The EL spectra of this device at different bias levels are shown in FIG. 14. They are nearly voltage independent. So the introduction of (ppz)$_2$Ir(dpm) EBL improved both efficiency and color stability of the device because of the successful confinement of electrons in the EL by the EBL.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device, comprising an electron blocking layer disposed adjacent to an emissive layer, wherein the electron blocking layer comprises a compound of the formula

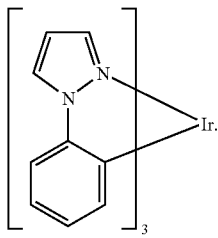

2. An organic light emitting device comprising
an anode;
a hole transporting layer;
an electron blocking layer comprising an electron blocking material;
an emissive layer disposed adjacent to the electron blocking layer;
an electron transporting layer; and
a cathode;
wherein the electron blocking material comprises a compound of the formula

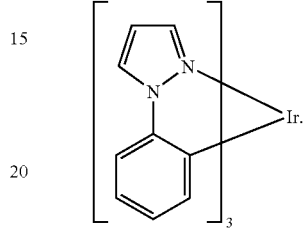

* * * * *